(12) United States Patent
Deml et al.

(10) Patent No.: US 6,696,742 B2
(45) Date of Patent: Feb. 24, 2004

(54) SEMICONDUCTOR MEMORY DEVICE

(75) Inventors: Christoph Deml, Munich (DE);
Massimo Atti, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/269,912

(22) Filed: Oct. 11, 2002

(65) Prior Publication Data
US 2003/0075773 A1 Apr. 24, 2003

Related U.S. Application Data
(60) Provisional application No. 60/329,649, filed on Oct. 16, 2001.

(51) Int. Cl.[7] .............................................. H01L 29/00
(52) U.S. Cl. ...................................................... 257/510
(58) Field of Search ................................ 257/510, 512, 257/513, 410, 411, 412, 751

(56) References Cited
U.S. PATENT DOCUMENTS
6,008,112 A  12/1999  Acocella et al.
2001/0018253 A1 * 8/2001  Nakamura et al. .......... 257/510

OTHER PUBLICATIONS
PCT International Search Report for International Application No. PCT/EP 01/11344, filed Oct. 1, 2001.
S.K. Lahiri, MNOS/Floating–Gate Charge Coupled Devices for High Density EEPROMS: A New Concept, 1998, Narosa Publishing House, New Delhi, India, pp. 951–956.

* cited by examiner

Primary Examiner—Edward Wojciechowicz
(74) Attorney, Agent, or Firm—Fish & Richardson P.C.

(57) ABSTRACT

A semiconductor memory device includes a semiconductor substrate having a first conductivity type and multiple parallel trenches extending in a first direction in the substrate. Each trench is filled with an isolation material and has an adjacent trench separated therefrom by a strip region. The device also includes multiple gate structures, for storing charge in a nonvolatile manner, arranged above the surface of the substrate and electrically isolated therefrom. The gate structures are arranged in parallel strips extending in a second direction that cross the strip regions. The device further includes multiple word lines, each of which is arranged on a corresponding gate structure from the multiple gate structures. The device also includes multiple active regions of a second conductivity type, each of which is arranged at one end of a corresponding strip region and each of which is electrically connectable to the gate structures of the corresponding strip region.

18 Claims, 17 Drawing Sheets

SEMICONDUCTOR MEMORY DEVICE

RELATED APPLICATIONS

This application claims the priority of U.S. Provisional Patent Application No. 60/329,649, entitled "Semiconductor Memory Device and Corresponding Manufacturing Method", and filed on Oct. 16, 2001.

TECHNICAL FIELD

The present invention relates to a semiconductor memory device and a corresponding method of manufacture.

BACKGROUND

S. K. Lahiri: MNOS/Floating-Gate Charge Coupled Devices for High Density EEPROMs: A New Concept, Physics of Semiconductor Devices, V. Kumar and S. K. Agarwal (eds.), Narosa Publishing House, New Dehli, India, 1998, pages 951–956, the basic idea of charge coupled device (CCD) electrically erasable programmable read-only memory (EEPROMS) is known. Particularly, this conference paper discloses the general idea to arrange EEPROM gate structures each having a floating and a control (CCD) gate above a substrate in rows separated by rails of active areas or injectors provided in the substrate. However, S. K. Lahiri fails to disclose a suitable memory address scheme for such a CCD EEPROM taking into consideration a dynamic clocking. Moreover, this document also fails to disclose appropriate cell layouts and operation modes.

For example, CCD devices are known from W. S. Boyle, G. E. Smith: Charge Coupled Semiconductor Devices. The Bell System Technical Journal. American Telephone and Telegraph Company: New York, Apr. 1970. Pages 587–593; Rudolf Müller: Bauelemente der Halbleiter-Elektronik. Springer Verlag: Berlin, Heidelberg, New York, London, Paris, Tokyo 1987. Pages 192–195; Kurt Hoffmann: VLSI-Entwurf. Modelle und Schaltungen. Oldenbourg Verlag: München, Wien 1996. Pages 296–297; and Lev I. Berger: Semiconductor Materials. CRC-Press: 1997. Page 445.

EEPROM devices are generally well known in the state of the art. EEPROM cells are used to store information, which is accessible after switching the power supply off and on again, while being able to modify the stored information multiple times by pure electrical means. EEPROM cells usually have source and drain contacts forming a MOS transistor. Information is read out by measuring the attributes of the output characteristic, which is dependent of the information stored in a gate structure having floating and control gate.

The overall transfer characteristic (programming conditions to read current) is highly nonlinear and strong dependent on several side effects and production fluctuations, i.e., the Fowler-Nordheim tunneling current is more than exponentially dependent on the electric field across the oxide. So the programming voltage and the oxide thickness have severe influence on the programming process. Thus, these parameters must be adjusted with high precision. These accuracy problems limit the multilevel ability of known cell concepts to 2 bits per cell.

Fast cells are critical and must be handled with complex algorithms. Usually, only cells of a single word line can be programmed at the same time. During sensing, there is a static current consumption through S and D of the MOS transistor. During parallel programming of cells in the test phase, there is a static current due to the gate induced drain leakage, which must be supplied by a charge pump. This current driving pump is area consuming.

Using drain and source contacts, the cell area of typical cells in embedded EEPROM modules results in $22*F^2$ to $70*F^2$. The world record for cells with drain and source contacts is $8.8*F^2$.

Nowadays new applications for non-volatile memories are borne, one of that is the possibility to store photos or music in solid state device. In this kind of application is required a sequential data access to the memory.

Therefore, it is an object of the present invention to provide an improved semiconductor memory device and a corresponding manufacturing method.

SUMMARY

The idea underlying the present invention is to combine the charge shifting, receiving or providing (from now on denoted only by shifting) ability and the possibility to store charge non-volatile in an oxide or on a floating gate (EEPROM) or a similar structure. The device or memory cells according to the invention will therefore be called charge coupled EEPROM cells or CC-EEPROM cells herein below.

In fact, by combining CCD and EEPROM technologies, it is possible to increase the density of the memory and—at the same time—to build a non-volatile memory that is sequentially addressable itself and even usable as a volatile memory.

CCD technique is known to operate with 8-bit resolution. In combination with the linear transfer characteristic of the charge coupled EEPROM and the self limiting programming, this provides deep multilevel ability. Fast cells do not have any influence on the programming process, because the programming stops, when all charge carriers tunneled to the floating gate. It is possible, to shift charge carriers into the cell area and to program a huge number of word lines in parallel. This cuts the programming time of some order of magnitude. There is no static current consumption during read. Minimum size cells ($4F^2$) are possible, because the cell does not have drain or source contacts. Reduction of logic in the bit line and word line section result in less chip area. There is an additional volatile memory functionality (i.e., using the same technology, it is also possible to implement high density memory buffer).

Preferred embodiments are listed in the respective dependent claims.

According to a preferred embodiment, the gate structures include a stack of a tunnel oxide, a floating gate, and an isolation structure.

According to another preferred embodiment, the active regions are arranged at different ends of neighboring strips.

According to another preferred embodiment, the active regions are electrically connectable to the gate structures of the corresponding strip using a respective control gate structure.

According to another preferred embodiment, the respective control gate structure runs in parallel with the respective outermost gate structures at the corresponding end.

According to another preferred embodiment, every third of the word lines is connected to a common wiring line.

According to another preferred embodiment, the second and first directions are perpendicular to each other.

According to another preferred embodiment, the doping concentration of the substrate is varied in a surface region of the strip regions.

According to another preferred embodiment, a region of the second conductivity type is buried in the substrate along the strip regions.

According to another preferred embodiment, the gate structures, the word lines and the trenches have minimum design width F forming a cell dimension of $4F^2$.

According to another preferred embodiment, there are the method of providing the trenches by means of an etching process using a hard mask, providing an oxide layer on the inner surface of the trenches; depositing a layer of isolation material on the resulting structure; planarizing the layer of isolation material by a chemical-mechanical polishing process such that it levels with the hard mask.

According to another preferred embodiment, there are the steps of removing the hard mask, providing a tunnel oxide layer and a first polysilicon layer over the resulting structure, and planarizing the first polysilicon layer by a chemical-mechanical polishing process such that it levels with the isolation material for forming a floating gate region.

According to another preferred embodiment, there are the steps of providing a third polysilicon layer over the resulting structure, and patterning the third polysilicon layer for forming an extension of the floating gate region.

According to another preferred embodiment, there are the steps of providing an isolation layer having contact holes between the first and third polysilicon layer, the contact holes being arranged for providing an electrical connection between the first and third polysilicon layer. This has the advantage that in the patterning step of the third polysilicon layer the isolation layer may act as etching stop preventing damage of the first polysilicon layer, if there is a mask misalignment.

According to another preferred embodiment, there are the steps of removing the hard mask, providing a tunnel oxide layer and a first polysilicon layer over the resulting structure, and patterning the first polysilicon layer for forming a floating gate region which partly overlaps the isolation material in the trenches.

According to another preferred embodiment, there are the steps of providing an isolation layer and a second polysilicon layer for forming a control gate region over the resulting structure; and forming the plurality of gate structures by patterning the tunnel oxide layer, first polysilicon layer, isolation layer and second polysilicon layer.

According to another preferred embodiment, there is at least one of the steps of enhancing the doping concentration of the substrate in a surface region of the strip regions using a first implantation process and burying a region of the second conductivity type in the substrate along the strip regions using a second implantation process.

Embodiments of the present invention are illustrated in the accompanying drawings and described in detail in the following.

DESCRIPTION OF THE DRAWINGS

Throughout the figures the same reference numbers indicate the same or funtionally equivalent means. The individual figures for explaining specific modes of operation do not include all details, but just the details needed for explaining the respective mode.

DESCRIPTION

Figure 1:
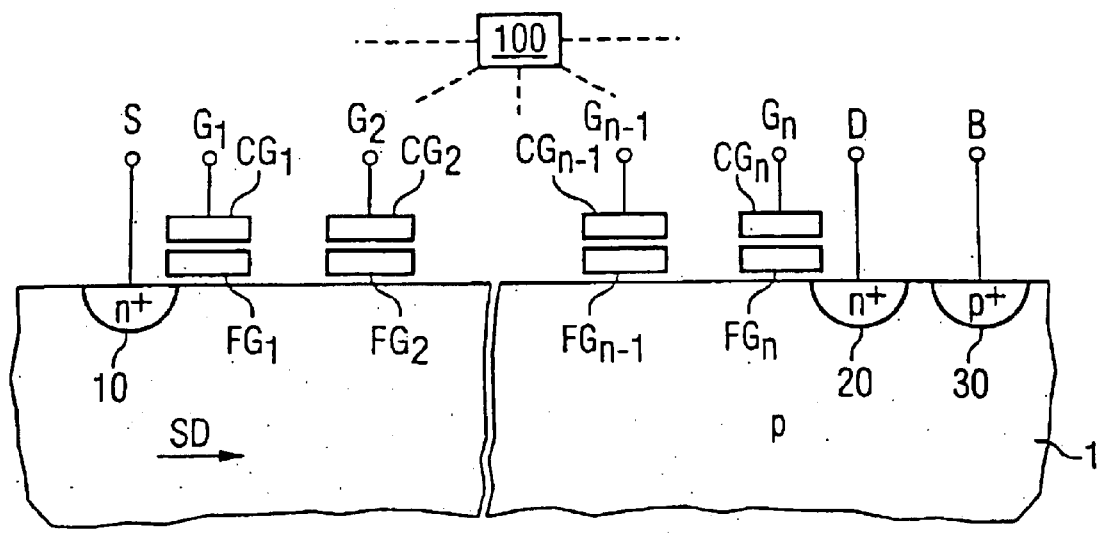
FIG. 1 is a view of a charge coupled electrically erasable programmable read-only memory (CC-EEPROM) cell arrangement.

Referring to FIG. 1, reference sign 1 denotes a p-type semiconductor substrate, i.e., a silicon substrate, having an $n^+$-type source region 10 and an $n^+$-type drain region 10, and having a $p^+$-type body contact 30.

Between the $n^+$-type source region 10 and drain regions 20 there is a plurality of aligned gate structures. The gate structures include floating gates FG1, FG2, . . . , FGn−1, and FGn above the substrate surface and electrically isolated therefrom. Moreover, each of the floating gates FG1, FG2, . . . , FGn−1, and FGn has a corresponding control gate CG1, CG2, . . . , CGn−1, CGn which is electrically isolated from each other. Thus the gate structures are similar to the gate structure of an EEPROM, however, here each of the gate structures have a floating and control gate pair aligned with preferably equidistant spacing.

S, G1, G2, . . . , Gn−1, Gn, D, B denote respective contacts of the corresponding source, drain, bulk, and gate regions. Only schematically shown in FIG. 1 is a voltage generator 100 for applying individual voltages between the gate structures CG1, FG1; . . . ; CGn, FGn and the active regions 10, 20 and body contact 30 such that a charge may be programmed, read, shifted, and erased from the gate structures CG1, FG1; ...; CGn, FGn. The voltage generator 100 is connected to the respective contacts of the corresponding source, drain, bulk, and gate regions S, G1, G2, ..., Gn–1, Gn, D, B. The associated functions will be described later.

The direction SD pointing from the source region 10 to the drain region 20 along the gate structures is called shifting direction. In this shifting direction SD, the intermediate cell gate structures are not flanked by a heavy source/drain doping like in normal EEPROM cells or MOS transistors—otherwise the charge isolating and conserving capability for the adjusted charge to be described later would vanish. However, to a certain limit, light source/drain doping may be acceptable.

The CC-EEPROM cell arrangement of FIG. 1 is arranged in a way, that a charge can be shifted from one gate structure to another, i.e., a CCD 1. The cell arrangement contains a minimum of one non-volatile cell. Gate structures of this arrangement need not all to be non-volatile cells (i.e., there may be gates just for shifting, gates just supplying volatile memory or gates next to a heavy source or drain doping) or need not all to be used for non-volatile storing (i.e., there may be dummy cells or gates next to a heavy source or drain doping). The gate alignment need not have straight-line characteristic, but meander, tree, parallel, ... structures are also possible.

The arrangement normally has a minimum of one contacted or uncontacted source/drain doping, which can act as a charge source or sink. This doping can be located on the beginning or end (edge) of the arrangement. There might be a bulk contact. Bulk can but need not be isolated from the substrate by any means (junction, oxide, insulator). A minimum cell area is feasible due to the minimum number of drain and source contacts.

Doping is a subject for trade off (see below) and can be done non-uniformly or differently under the tunnel oxide on the one hand and under the spacing between two gates on the other. However, also uniform doping is possible.

For shifting inversion charge from one gate structure to the other, the depletion regions, which are induced by these gates, touch laterally. This is achieved at relatively low or medium voltages, when the effective doping between these gates is low. Thus, a low intrinsic bulk doping or a contra doping is preferred.

Programming voltage is shared by the inter poly oxide (between floating and control gate), the tunnel oxide (both effects known from normal EEPROM cells) and an unwanted, extending depletion region under the cell.

In order to achieve the electrical field in the tunnel oxide, needed for Fowler-Nordheim tunneling, at a minimum programming voltage, this depletion region can be limited by a heavy doping beneath the tunnel oxide, eventually spaced to the semiconductor surface.

Heavy doping is in contradiction to the need mentioned above regarding charge shifting. Therefore, the above mentioned trade-off is found with practice. In any case, low doping is needed only at the surface.

Generation and recombination limit the available time after start of adjusting charge quantities to completion of reading or programming. The buried CCD approach known from R. H. Walden, R. H. Krambeck, R. J. Strain, J. McKenna, N. L. Schryer, G. E. Smith: The Buried Channel Charge Coupled Devices. The Bell System Technical Journal. American Telephone and Telegraph Company: New York, Sep. 1972. Pages 1635–1640; and D. J. Burt: Basic Operation of the Charge Coupled Device. Proc. Int. Conf. Technol. Applic. CCD. Edinburgh University: Edinburgh 1974, Pages 1–12, which is used to cope with the high generation and recombination at the semiconductor/oxide interface, increases the read immunity and requires increased program voltage.

Figure 2:
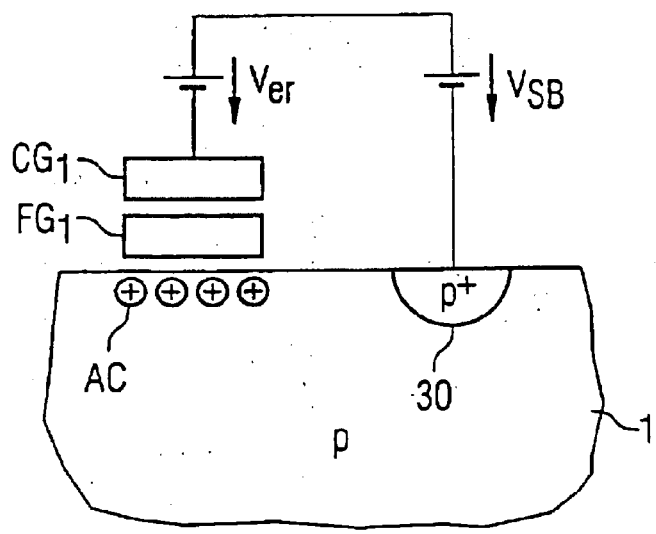
FIG. 2 is a diagram of an erase mode for a specific gate structure of the CC-EEPROM cell arrangement.

FIG. 2 shows the erase mode for a specific single gate structure CG1, FG1 of the CC-EEPROM cell arrangement.

In order to explain that this example is compatible with normal non-volatile memory operation, here it is showed, how to erase one cell having control gate CG1 and floating gate FG1 or all in parallel, applying appropriate bias and using the well known Fowler-Nordheim tunneling.

Erasing is done by applying an electrical field to the tunnel oxide in the orientation, that majority charge carriers, here holes (+), are accumulating on the semiconductor surface in an accumulation region AC. Thereby, electrons (−) stored in the floating gate FG1 may be extracted. Therefore, an erase voltage $V_{er}$ is applied across a minimum of one CCD cell line bulk on the one hand and a minimum or one cell control gate on the other. This erase voltage $V_{er}$ of typically 16–18 V physically adds to the source-bulk-voltage $V_{SB}$ of typically greater than −0.7 V. Here and in the following description all voltages are referred to the source voltage, however, this is just one of several possibilities.

Erase is not self-limiting and cells behave differently, so one or more read verify plus program cycles may complete the erase step.

Next, programming of the CC-EEPROM cells will be explained. In known memory devices, programming was always performed with unlimited charge for a predetermined time period. However, according to this example programming either can be done with unlimited charge or with limited charge.

Particularly, programming with an unlimited charge source provides a random access possibility.

Programming voltage and/or programming time adjust the amount of charge, which is tunneling from the inversion layer through the tunnel oxide to the floating gate (Fowler-Nordheim tunneling) or is injected into the tunnel oxide (channel hot electron).

Figure 3:
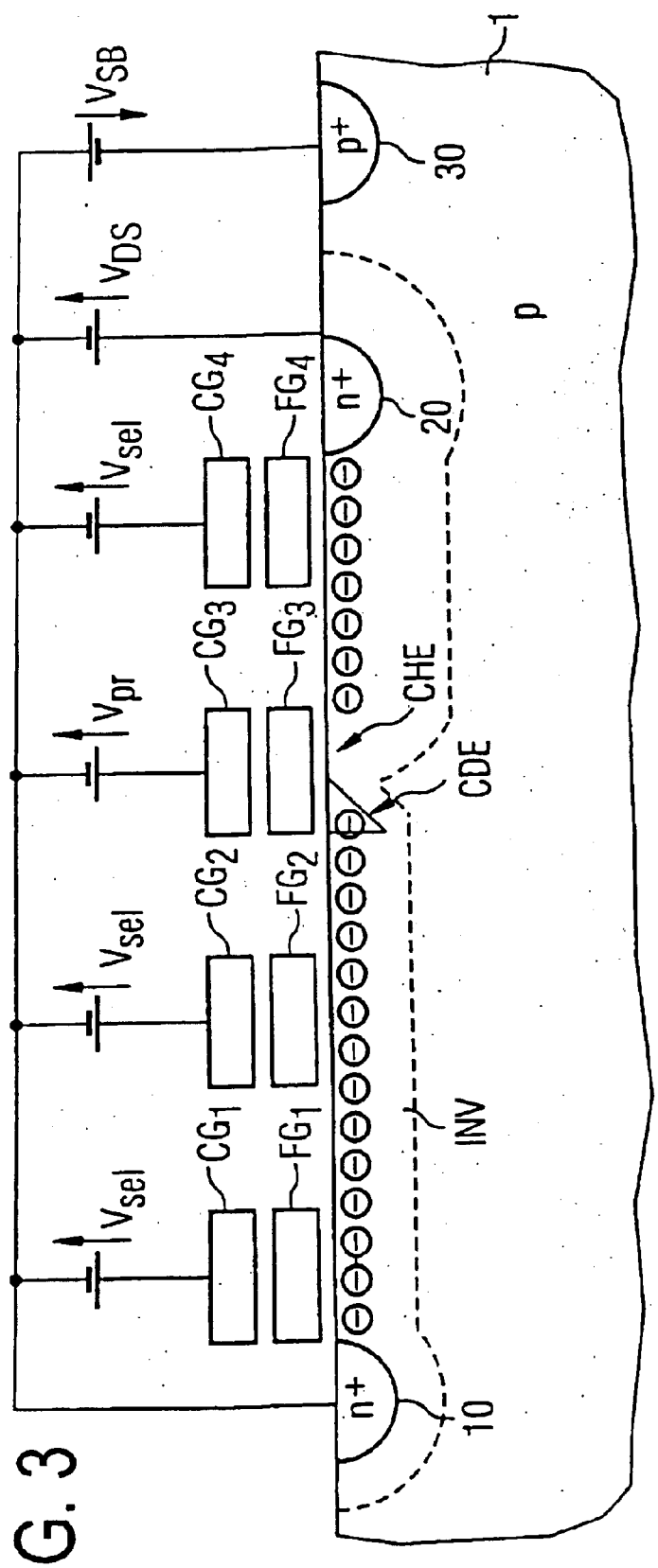
FIG. 3 is a diagram of the channel hot electron programming mode for a specific gate structure of the CC-EEPROM cell arrangement.

FIG. 3 shows the channel hot electron programming mode for a specific gate structure of the CC-EEPROM cell arrangement.

This structure is operated similarly to a NAND CHE (channel hot electron) EEPROM. The source/drain doping in between two cells is functionally substituted by supplying an appropriate $V_{sel}$ to all cells, which is not programmed, so that the gaps between cells have a continuous inversion layer INV. The cell having the gate structure FG3, CG3 to be programmed is supplied with a programming voltage $V_{pr}$ which is smaller than $V_{sel}$, while $V_{sel}$ is greater than $V_{DS}$. These voltages add to the source-bulk-voltage $V_{SB}$.

By supplying these voltages, a charge density CDE is created below the gate structure FG3, CG3. At the location where this charge density CDE is nearly zero, a channel hot electron region CHE is created from where hot electrons can enter into the floating gate FG3.

When using channel hot electron programming, it is also possible to use a SONOS gate structure leaving out the floating gate, as described in Boaz Eitan, Paolo Pavan, Ilar Bloom, Efraim Aloni, Aviv Frommer, David Finzi: NROM: A Novel Localized Trapping, 2-Bit Nonvolatile Memory Cell. IEEE Electron Device Letters, Vol. 21, No. 11. IEEE: November 2000. Pages 543–545.

Figure 4:
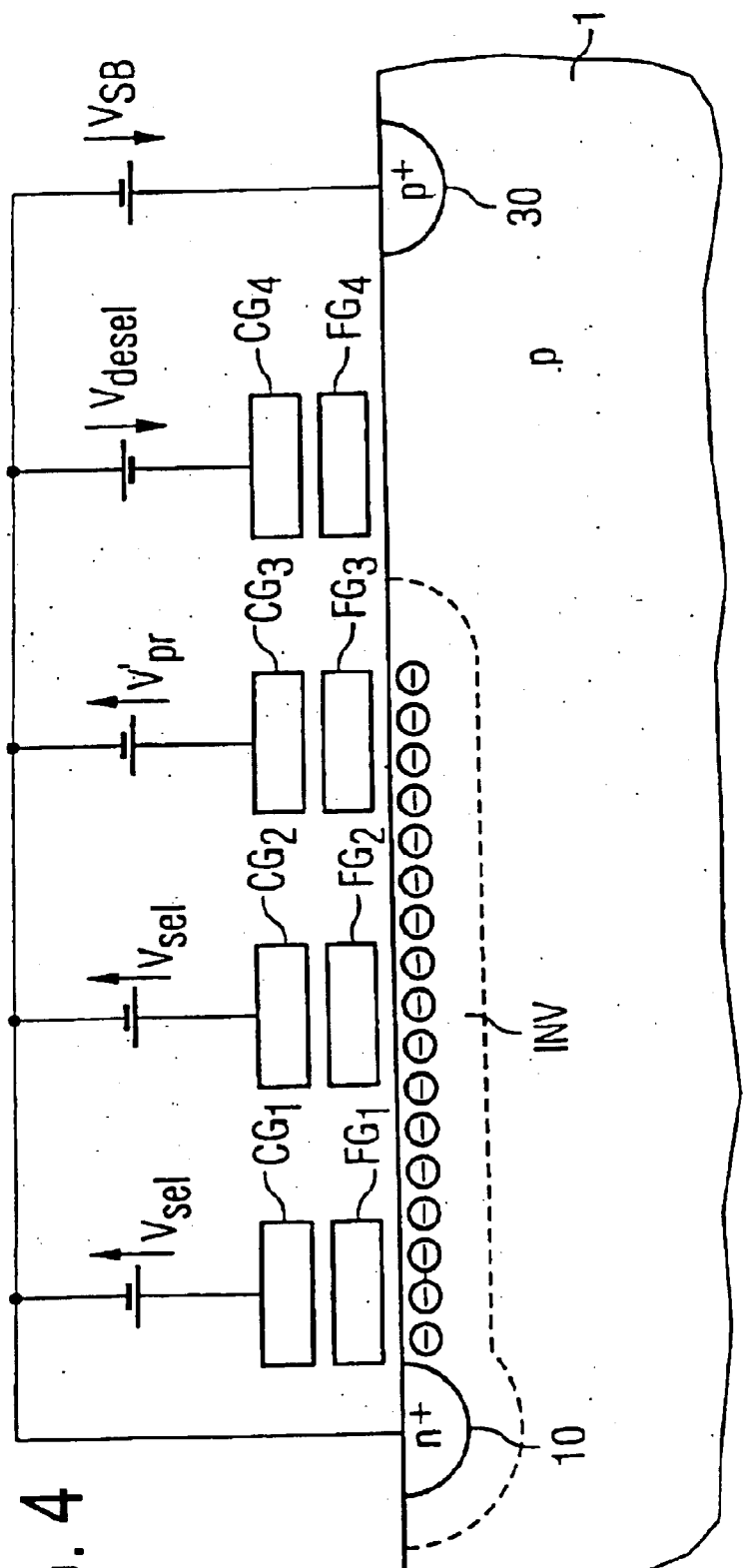
FIG. 4 is a diagram of the Fowler-Nordheim programming mode for a specific gate structure of the CC-EEPROM cell arrangement.

FIG. 4 shows the Fowler-Nordheim programming mode for a specific gate structure of the CC-EEPROM cell arrangement with unlimited charge source.

An inversion layer INV is built up from the source 10 to the cell having the gate structure FG3, CG3 which is programmed. This can be done by selecting and deselecting other cells in an appropriate manner or by another special gate structure, which is placed near by every cell (i.e., in the third dimension).

Here, the select voltage $V_{sel}$ is applied to the two left hand cells and a deselect voltage $V_{desel}$ is applied to the right hand neighbor cell. The cell having the gate structure FG3, CG3 to be programmed is supplied with a programming voltage $V'_{pr}$ which is greater than $V_{pr}$ in the case of channel hot electron programming. Fowler-Nordheim programming mode has the advantage that it is current saving in comparison to channel hot electron programming, because no current flow exists between source and drain 10, 20.

Next, programming with a limited charge will be explained. Programming with a limited charge source is done in three steps: adjusting charge quantity, shifting the charge to the cell to be programmed and finally programming, which means that this charge is tunneled to the floating area of the cell to be programmed.

Adjusting and shifting charge can be done in parallel, so that a huge fraction of the sector can be filled with this information carrying charge quantities, which can finally be programmed in parallel (burst programming). In other words, having a two-dimensional array of CC EEPROM cells, first the information of all cells may be shifted under the array, and then all the information may be programmed in a single step. Because programming is time consuming (several milliseconds for Fowler-Nordheim tunneling), this parallel programming dramatically speeds up the memory filling with a continuous data stream (burst).

There is no need for a special page buffer, which results in a smaller chip area due to the reduced logic in the bit line section.

The programming of a cell ends automatically when all charge beneath the tunnel oxide is tunneled to the floating gate. A self-limiting programming is achieved, supplying a multilevel ability, even in case of fast cells.

Figure 5A:
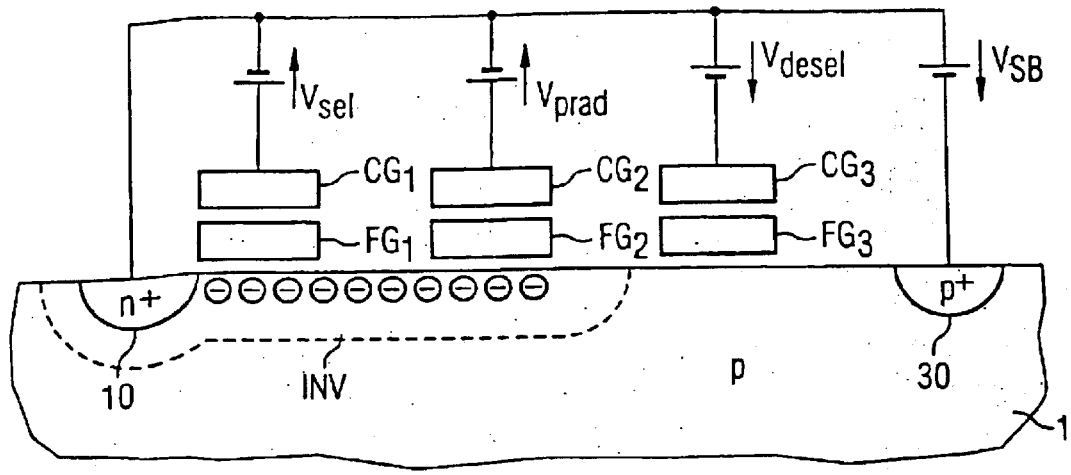
FIGS. 5A and 5B show the adjust charge mode for programming a limited charge for a specific gate structure of the CC-EEPROM cell arrangement.
Figure 5B:
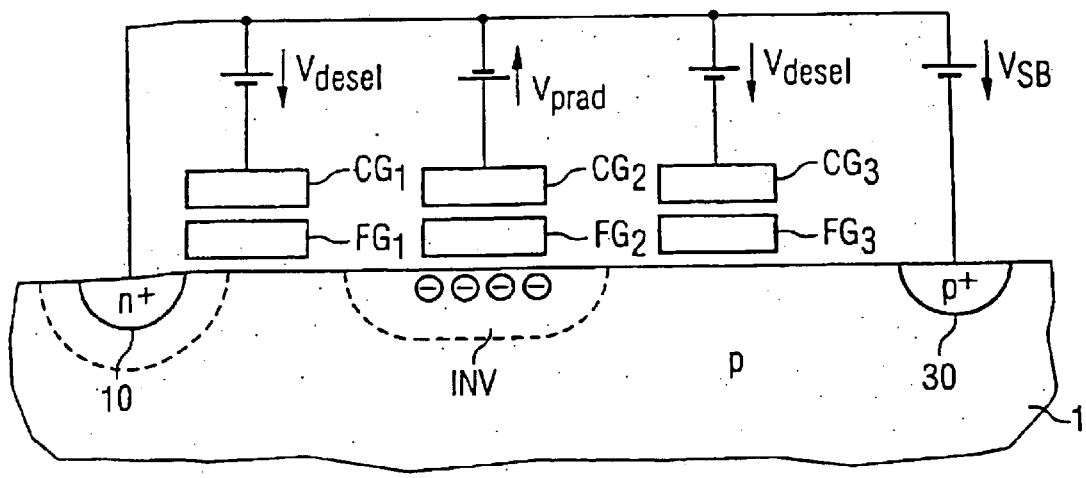

FIGS. 5A and 5B show the adjust charge mode for programming a limited charge for a specific gate structure of the CC-EEPROM cell arrangement.

Techniques for adjusting the charge quantity which will be programmed later on are well known from charge-coupled devices (CCD filters).

First, as illustrated in FIG. 5A a continuous inversion layer INV is built up from the source 10 to the adjusting gate structure CG2, FG2 by selecting the gate structure CG1, FG1 in between. Moreover, the right hand neighbor gate structure CG3, FG3 is deselected.

The amount of charge $Q_{lpr}$ is adjusted by the program adjust voltage $V_{prad}$ which is linearly related by the following formula:

$$Q_{lpr} = -A_{ox}(C_{ox}''(V_{prad} - V_{FB} - 2\Phi_F) - \sqrt{2q\epsilon_0\epsilon_{Si}N_A(2\Phi_F + V_{SB})}) \quad (0)$$

which is valid in the case that the adjusting MOSFET does not have a floating gate. Here $\Phi_F$ is the Fermi potential, $V_{FB}$ the flatband voltage, $V_{SB}$ the source-bulk voltage, and the remaining terms are constants. If the adjusting MOSFET has a floating gate, then formula 11 below applies.

Then, with reference to FIG. 5B this adjusted charge is separated from the source 10 by deselecting the gate structure CG1, FG1 between the source 10 and the adjusting gate structure CG2, FG2.

Instead of adjusting the charge quantity by the $V_{prad}$ voltage, the desired charge amount could also be brought in via the source contact S (see FIG. 1) which would not be at a fixed potential in this case. The charge can also be delivered by a charge adjusting circuitry which is connected to the source contact.

The cell having the gate structure CG1, FG1 next to the source 10 is a dummy cell (no information storage is possible in limited charge programming mode) and in principle needs not to have a floating gate. The next cell, to which $V_{prad}$ is applied, could also be a dedicated transistor.

Adjusting can be done in parallel to reading another word line as explained later.

Figure 6A:
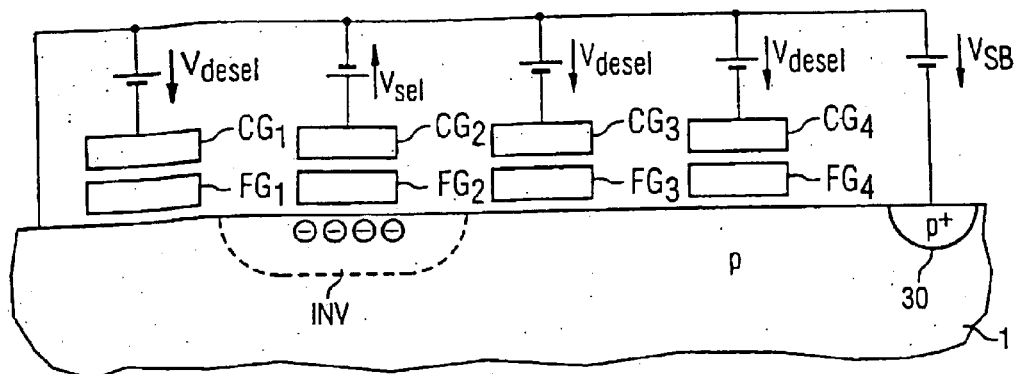
FIGS. 6A–6C show the charge shifting mode for shifting a limited charge for a specific gate structure of the CC-EEPROM cell arrangement.
Figure 6B:
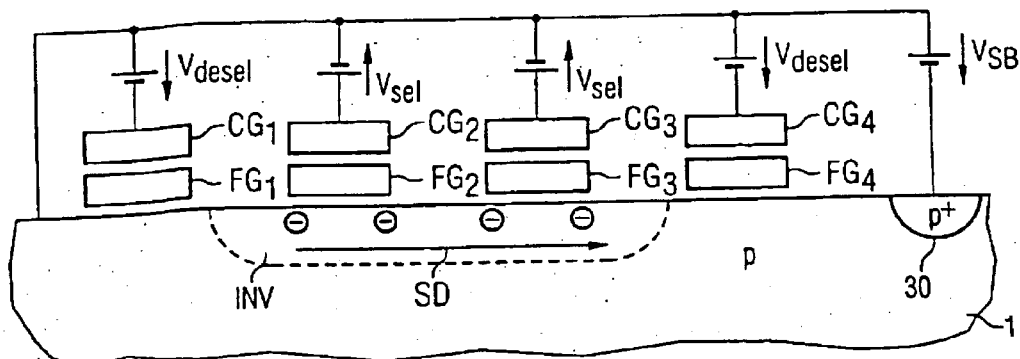
Figure 6C:
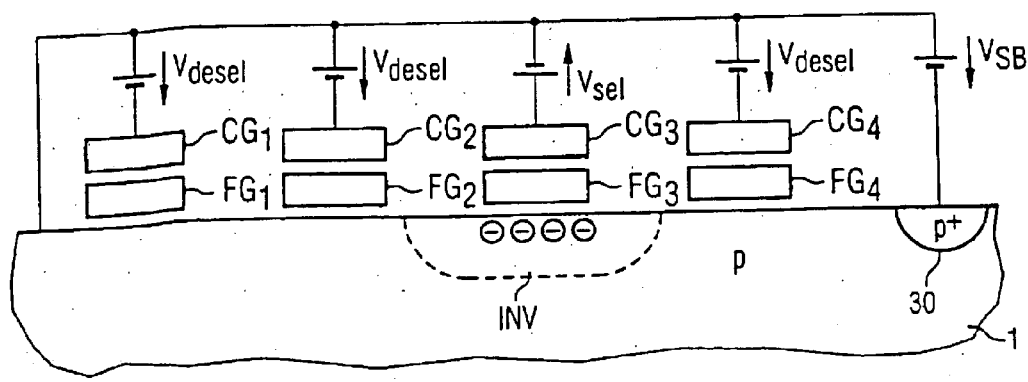

FIGS. 6A–6C show the charge shifting mode for shifting a limited charge for a specific gate structure of the CC-EEPPOM cell arrangement.

Charge shifting from one cell to another is well known and vastly documented for charge-coupled devices (CCD camera, CCD filter).

The easiest way to achieve this is to interconnect the control gate of every third cell. This results in only three word lines, which must be driven in an appropriate manner. So, a corresponding word line section needs less control logic and less driving units, resulting in a reduced chip area.

As shown in FIG. 6A, the starting situation is identical with the situation of FIG. 5B. Additionally shown is the gate structure having control gate CG4 and floating gate FG4 which is also deselected.

Referring to FIG. 6B, the gate structure CG3, FG3 is then selected by applying selection voltage $V_{sel}$. As a consequence, inversion layer INV expands to the gate structure CG3, FG3.

Now, as shown in FIG. 6C, the gate structure CG2, FG2 is de-selected by applying deselection voltage $V_{desel}$. As a consequence, inversion layer INV contracts to the gate structure CG3, FG3 which remains selected.

By the above process sequence, the limited charge quantity is shifted from one cell to the other.

Figure 7:
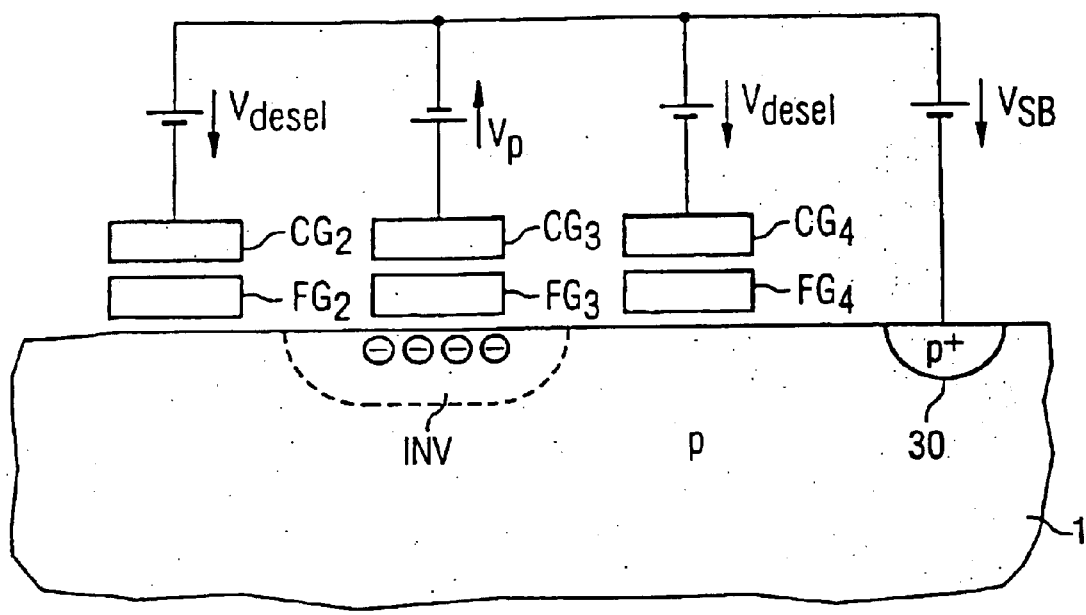
FIG. 7 shows the Fowler-Nordheim programming mode for programming a limited charge for a specific gate structure of the CC-EEPROM cell arrangement.

FIG. 7 shows the Fowier-Nordheim programming mode for programming a limited charge for a specific gate structure of the CC-EEPROM cell arrangement.

Non-volatile programming is done by applying programming voltage $V_{pr}$ to the control gates of cell having the gate structure CG3, FG3 which is programmed, leaving the neighbor cells de-selected.

The equation for the Fowler-Nordheim tunneling current density according to Georg Tempel: Reprogrammable Silicon-based Non Volatile Memories. Infineon Technologies AG. CPD IPD RC IMEC: Leuven, Belgium 2001. Page 1–29, reads:

$$J_{FG} = \alpha E_{tox}^2 \varepsilon^{-\frac{\beta}{E_{tox}}} \quad (1)$$

$$E_{tox} = \frac{V_{FG} - V_t}{d_{tox}} \quad (2)$$

$$\alpha = \frac{m}{m^*} \frac{q^3}{8\pi h \Phi_b} \quad (3)$$

$$\beta = 4\sqrt{2m^*} \frac{2\pi}{3hq} \Phi_b^{\frac{3}{2}} \quad (4)$$

with

| | | |
|---|---|---|
| h | $6.6 \cdot 10^{-34}$ Js | Planok's constant |
| $\Phi_b$ | 3.2 eV | energy barrier |
| | (Si—SiO$_2$) | at injecting interface |
| g | $1.6 \cdot 10^{-19}$ C | charge of single electron |
| m | $9.1 \cdot 10^{-31}$ kg | mass of free electron |
| m* | 0.42 m | effective mass of |
| | (SiO$_2$) | electron in band gap | and was originally derived under the assumption that the conduction band is filled with charge carriers.

However, when using the CCD principle for shifting charge beneath the floating gate in order to program, this charge is limited and steadily decreasing when charge carriers tunnel onto the floating gate during programming phase. Therefore it is assumed that the tunneling probability for each charge carrier is identical. This results in an approximately exponential tunneling current drop by time (neglecting electric field reduction due to charging of the floating gate).

Thus, using the CCD principle, a single programming procedure will approximately take 3 times longer than usually as rule of thumb. However, using burst programming, there will be still an enormous time saving compared to conventional programming time.

The limited charge programming procedure may also be done in two steps, namely first program adjust beneath the cell to be programmed (like read adjust in FIG. 5) and secondly program the charge to the floating gate as mentioned above.

Next, reading of the cells will be explained. There are two different possible reading modes, the NAND mode and the CCD mode.

The NAND mode reading provides a random access. The situation of reading in NAND mode is very similar to channel hot electron programming. Only the applied read voltage $V_{read}$ is different.

Figure 8:
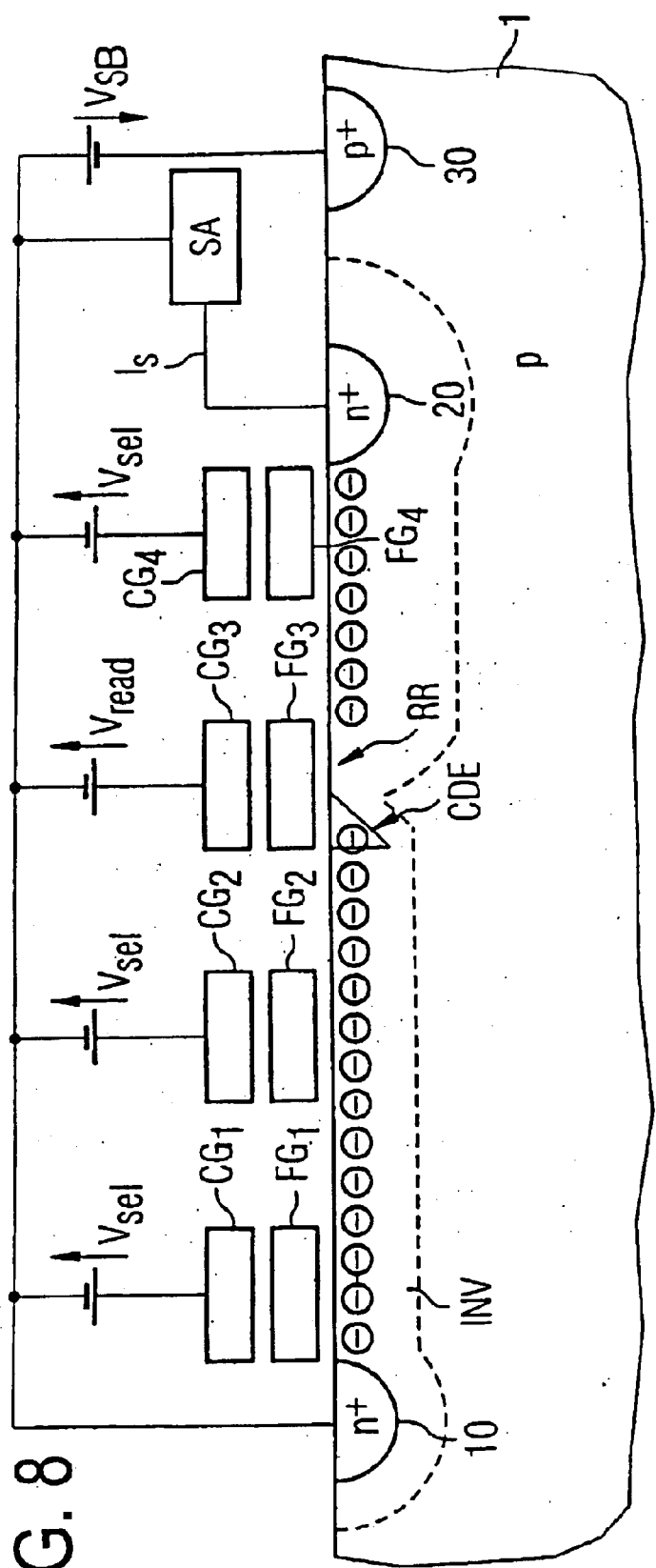
FIG. 8 shows the NAND reading mode for a specific gate structure of the CC-EEPROM cell arrangement.

FIG. 8 shows the NAND reading mode for a specific gate structure of the CC-EEPROM cell arrangement.

As a consequence of the applied voltages, namely $V_{sel}$ to the cells not to be read and $V_{read}$ to the cell to be read, there is a static current flow $I_s$ which may be sensed by a sense amplifier SA.

In analogy with the CCD programming mode, the CCD reading mode includes three operation procedures: adjusting read charge, shifting charge towards the output and sensing the charge. There is no static current consumption. As a consequence of the shifting procedure, there is only a burst reading without a random access possibility.

Here, the charge density CDE in the reading region RR depends on the information stored in the cell.

Figure 9A:
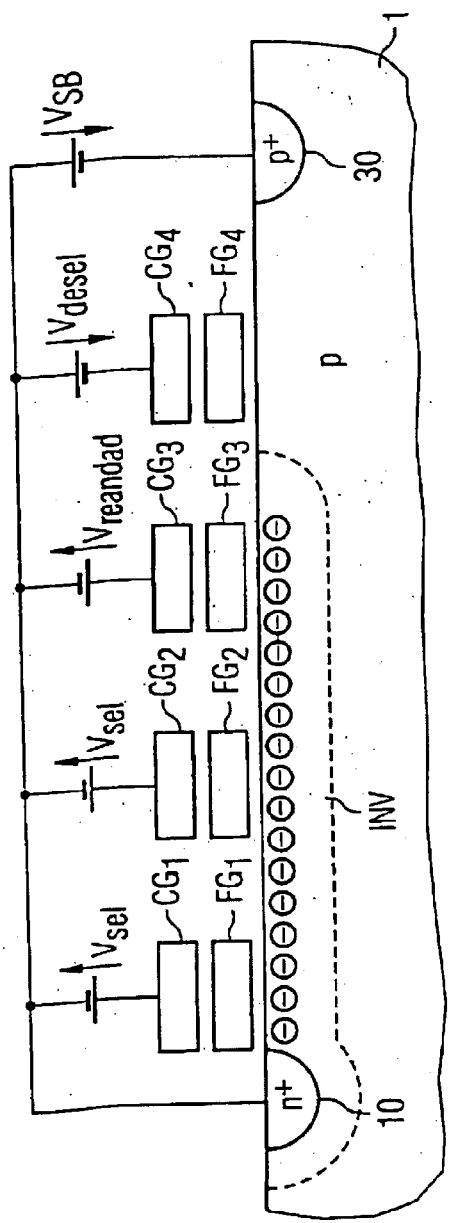
FIGS. 9A–9B show the adjust charge mode for reading a limited charge for a specific gate structure of the CC-EEPROM cell arrangement.
Figure 9B:
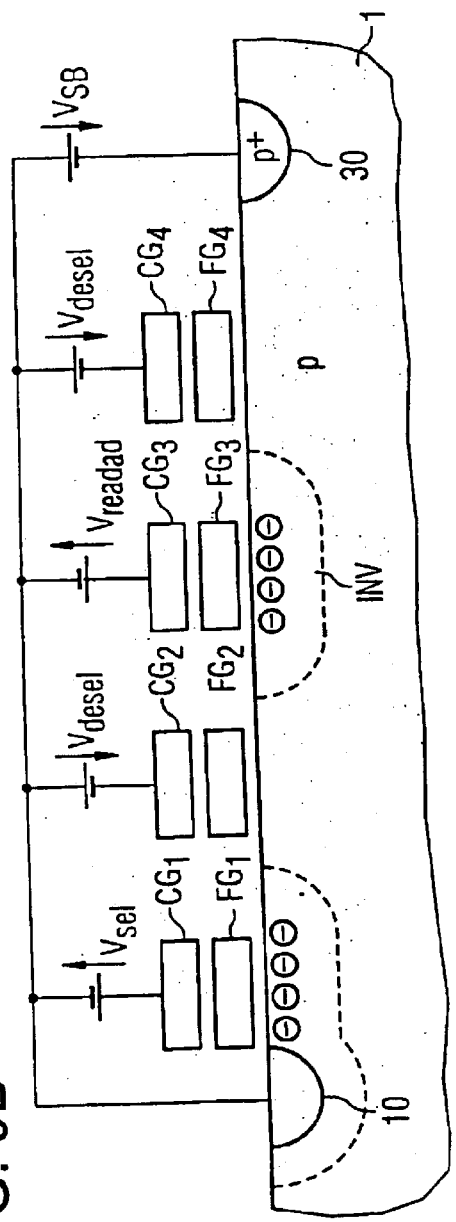

FIGS. 9A and 9B show the adjust charge mode for reading a specific gate structure of the CC-EEPROM cell arrangement.

Adjusting the reading charge is a preparation phase for the reading. It can be done in parallel to reading another word line.

According to FIG. 9A, an inversion layer INV is built up from the source 10 to the cell having gate structure CG3, FG3 which is to be prepared. This can be done by selecting and deselecting other cells in an appropriate manner or by another special gate structure, which is placed near by every cell.

Here, the select voltage $V_{sel}$ is applied to the two left hand cells and a deselect voltage $V_{desel}$ is applied to the right hand neighbor cell. The cell having the gate structure FG3, CG3 to be prepared is supplied with a read adjust voltage $V_{readad}$ such that the charge of the inversion layer INV under the cell is a function of the charge on the floating gate. $V_{sel}$ is greater than $V_{readad}$, so that the depletion region under the shifting cell is independent of the stored charge on the floating gate of other cells.

According to FIG. 9B, the inversion layer charge is finally separated from the continuous inversion layer INV to the source 10 by deselecting the neighbor gate having the gate structure CG2, FG2.

After adjusting the charge for reading, the charge must be shifted towards the output node by the shifting mode explained above with regard to FIG. 6.

Figure 10A:
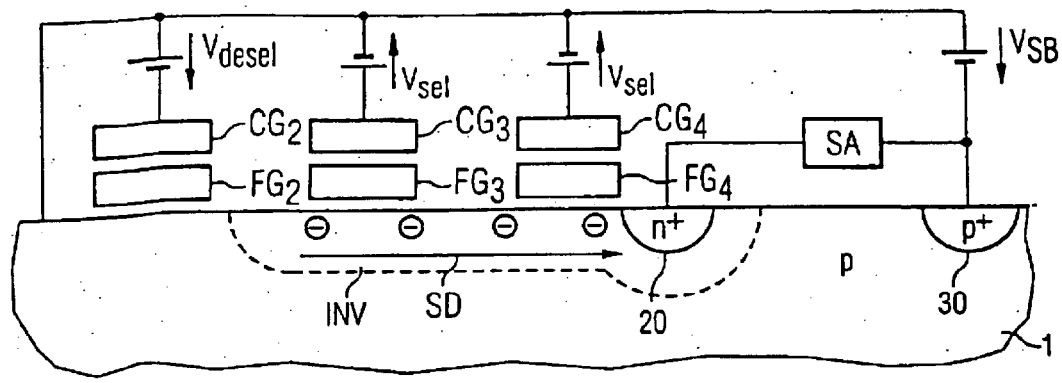
FIGS. 10A–10C show the charge sink and sense amplifier for a specific gate structure of the CC-EEPROM cell arrangement.
Figure 10B:
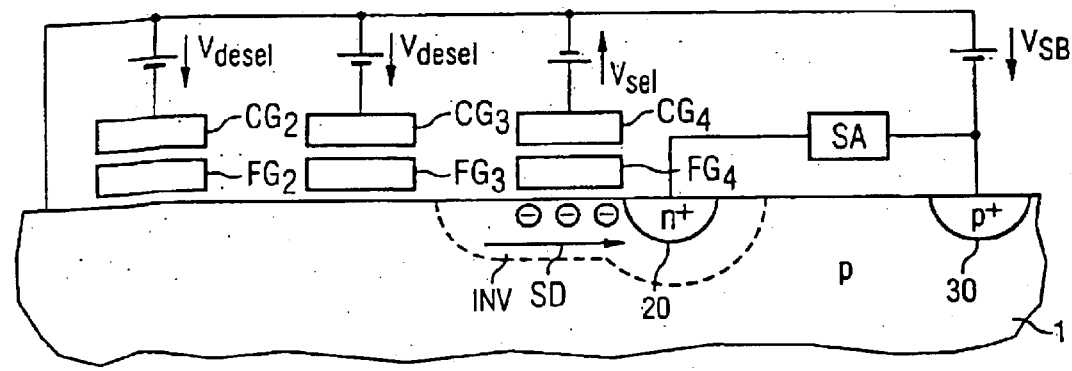
Figure 10C:
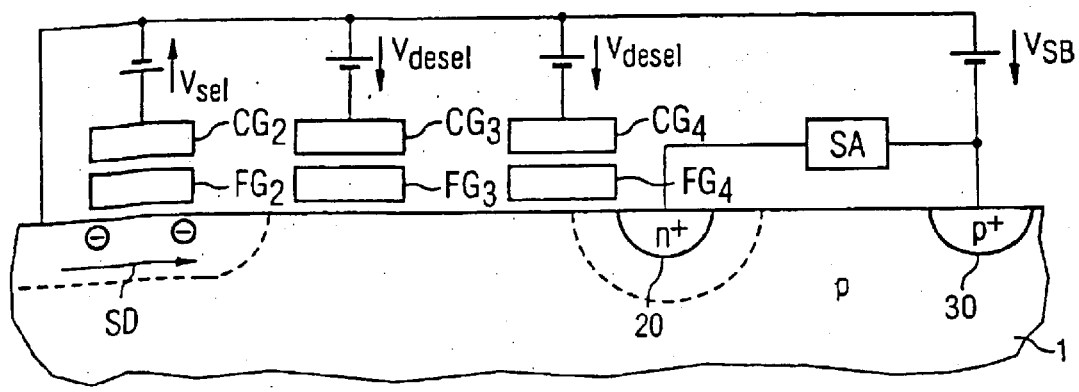

FIGS. 10A–10C show the charge sink and sense amplifier for a specific gate structure of the CC-EEPROM cell arrangement.

Sensing is done in parallel to the charge shifting. The sense amplifier SA is connected to the output node, which acts as a charge sink for the shifted charge. As the output node, either the drain 20 or the source 10 can be used. The cell next to the drain 10 is a dummy cell and needs not to have a floating gate (i.e. the floating gate may be omitted or the floating gate and control gate may be shorted).

Sensing is well known and documented for charge coupled devices such as CCD camera, CCD filter etc. These known sensing devices proved to be capable sensing at an 8-bit resolution, and facilitate deep multilevel sensing ability for CC-EEPROM cells according to this example.

According to FIG. 10A, the cell having gate structure CG2, FC2 is deselected, and the cells having gate structures CG3, FG3 and CG4, FG4 are selected. So, the charge to be read is shifted to the drain 20 from the gate structure FG3, CG3.

According to FIG. 10B, the cell having gate structure CG4, FG4 is selected, and the cells having gate structures CG2, FG2 and CG3, FG3 are deselected. So, the charge to be read is isolated at the drain 20 from the gate structure FG3, CG3.

According to FIG. 10C, the cell having gate structure CG2, FG2 is selected, and the cells having gate structures CG3, FG3 and CG4, FG4 are deselected. So, new charge to be read coming from gate structure CG1, FC1 (not shown in FIG. 10C) is transferred to the gate structure FG2, CG2.

Next, the read transfer characteristic will be evaluated. Heretofore, the following physical quantities must be considered:

| | |
|---|---|
| $C_{tox}$ | tunnel oxide capacitance |
| $C_{D,abs}$ | absolute depletion region capacitance |
| $C_{sp}$ | inter poly capacitance |
| $C_{fr}$ | fringing capacitance |
| $Q_A$ | ambient charge |
| $Q_{CG}$ | control gate charge |
| $Q_D$ | depletion region charge |
| $Q_{FG}$ | floating gate charge |
| $Q_I$ | inversion layer charge |
| $V_A$ | ambient voltage |
| $V_{CG}$ | control gate voltage |
| $V_{FG}$ | floating gate voltage |
| $V_I$ | inversion layer voltage |
| $V_b$ | bulk voltage |

$V_{CG} = V_{adjust} - V_{FB} + V_b + V_{SB}$ control gate potential
(where Vadjust is the respective adjust voltage)

| | |
|---|---|
| $V_{FB} = -kT/q \ln (N_A N_{D,CG}/n_1^2)$ | flat band voltage |
| $V_I = 2 \Phi_F + V_{SB} + V_b$ | inversion layer potential |
| $\Phi_F = kT/q \ln (N_A/n_1)$ | Fermi potential |

In order to be neutral outside of the structure, the sum of all charges must be zero.

$$Q_{FG}+Q_{CG}+Q_A+Q_I+Q_D=0 \quad (5)$$

The equations for the oxide capacitances are $$Q_{CG}=C_{ip}(V_{CG}-V_{FG}) \quad (6)$$

$$Q_A=C_{fr}(V_A-V_{FG}) \quad (7)$$

$$Q_I+Q_D=C_{tox}(V_I-V_{FG}) \quad (8)$$

Equation (8) is rewritten to be $$V_{FG} = V_I - \frac{Q_I + Q_D}{C_{tox}} \quad (9)$$

The equation for the depletion region capacitance is $$Q_D = -\sqrt{2q\epsilon_0\epsilon_{Si}N_A(V_I-V_b)} * A_{tox} \quad (10)$$

where $C_{D,abs}$ denotes an absolute capacitance. Equations (6), (7), (9) and (10) inserted in equation (5) result in $$Q_I = -\gamma Q_{FG} + Q_0 \quad (11)$$

$$\gamma = \frac{C_{tox}}{C_{tox} + C_{ip} + C_{fr}} \quad (12)$$

with $$Q_0 = \sqrt{2q\epsilon_0\epsilon_{Si}N_A(2\Phi_F - V_{SB})} * A_{tox} - \quad (13)$$
$$\gamma C_{ip}(V_{adjust} - V_{FB} - 2\Phi_F) - \gamma C_{fr}(V_A - 2\Phi_F - V_{SB} - V_b)$$

This equation shows that the inversion layer charge is linear dependent of the floating gate charge. This clearly reveals the multilevel ability of of the CC-EEPROM cell arrangement.

A volatile memory functionality of unused memory sectors is achieved by the following steps: adjusting charge quantity, shifting this charge under the desired gate structure, storage phase, shifting the charge to the output node and finally sensing the charge. This storage mode has either a first in first out or a first in last out behavior, namely dependent on what the output node is, i.e., source or drain. It can be used e.g., for storing the data to be programmed in another sector in order to realize a target programming algorithm.

Figure 11:
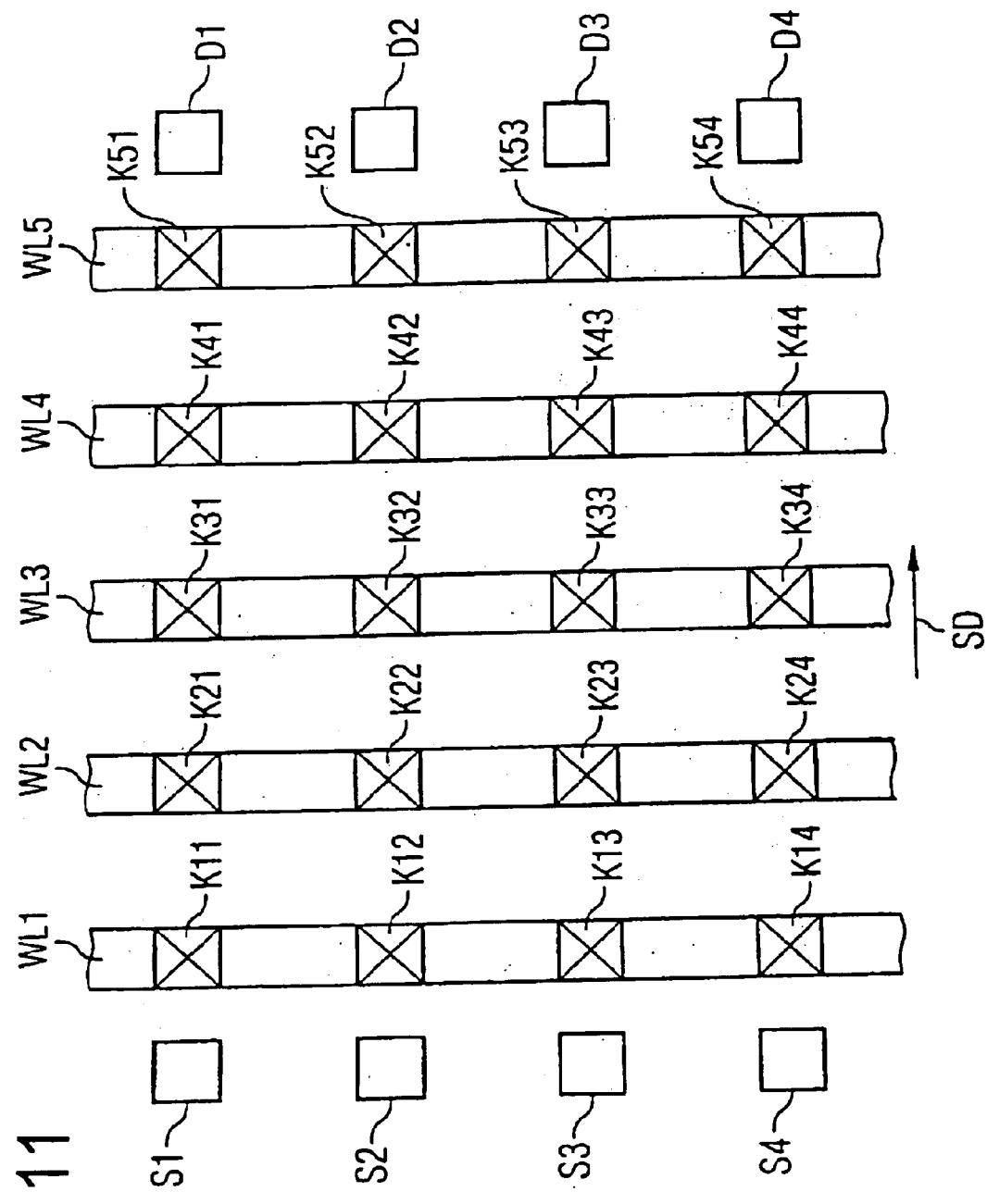
FIG. 11 is view of the two-dimensional CC-EEPROM cell arrangement.

FIG. 11 shows a two-dimensional top view of a CC-EEPROM cell arrangement. In FIG. 11, reference signs WL1–W5 denote five different word lines arranged in parallel and equidistantly. S1–S4 and D1–D4 denote respective source and drain regions.

Between source S1 and drain D1, there are five gate structures each including a floating gate and a control gate, the control gates being formed by the word lines WL1–WL5 at overlapping points K11, K21, K31, K41, K51 with the floating gates.

Between source S2 and drain D2, there are five gate structures each including a floating gate and a control gate, the control gates being formed by the word lines WL1–WL5 at overlapping points K12, K22, K32, K42, K52 with the floating gates.

Between source S3 and drain D3, there are five gate structures each including a floating gate and a control gate, the control gates being formed by the word lines WL1–WL5 at overlapping points K13, K23, K33, K43, K53 with the floating gates.

Between source S4 and drain D4, there are five gate structures each including a floating gate and a control gate, the control gates being formed by the word lines WL1–WL5 at overlapping points K14, K24, K34, K44, K54 with the floating gates.

Not shown in FIG. 11 for simplification are isolation structures between shifting channels.

By sequentially applying appropriate voltages to the word lines WL1–WL5 and to the source and drain regions S1–S4 and D1–D4, information can be shifted in parallel along the shifting direction SD under the gate structures of word line WL2 and WL4 and simultaneously be programmed with a single programming burst. In analogy reading may be performed by shifting out the information in parallel along the shifting direction SD to the drains D1–D4.

FIGS. 12A–12J show a schematic cross-sectional illustration of processing steps for manufacturing the two-dimensional CC-EEPROM cell arrangement according to a first embodiment of the present invention in the word line direction.

Figure 12A:
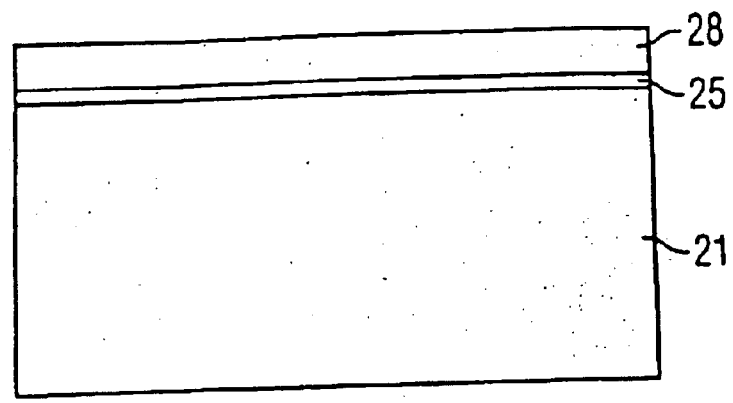
FIGS. 12A–12J are a schematic cross-sectional illustration of processing steps for manufacturing the two-dimensional CC-EEPROM cell arrangement according to a first embodiment of the present invention in the word line direction.

In FIG. 12A reference sign 21 denotes a P-type silicon substrate, i.e., a silicon wafer substrate. Provided on the substrate 21 are a thermal pad oxide layer 25 and a pad nitride layer 28.

Figure 12B:
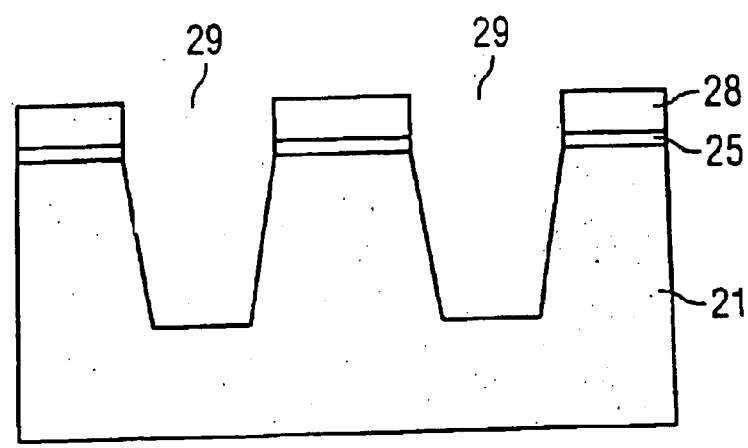
Figure 12C:
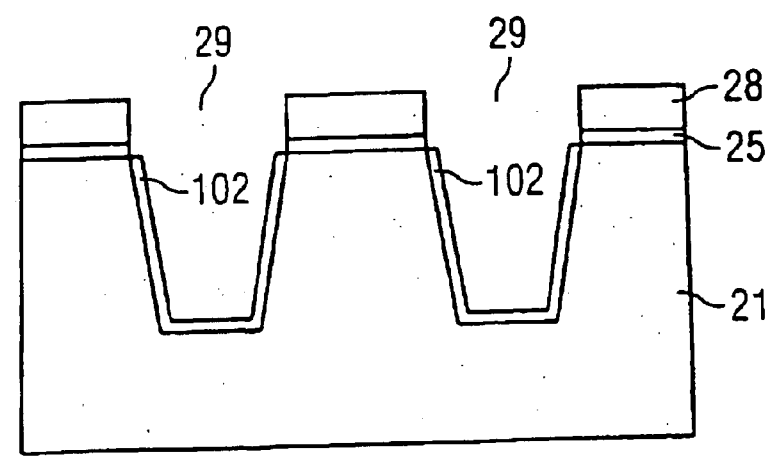

With reference to FIG. 12B the pad nitride layer 28 and pad oxide layer 25 are structured into the form of a hard mask by a conventional photolithographic process. In a next process step the hard mask is used as a mask in an etching process for forming trenches 29 in the substrate 21. The etching process is for example an anisotropic plasma etching process. Thus, the structure shown in FIG. 12B is obtained.

In a next step, a thermal oxidation is performed to build up a trench oxide layer 102 in the interior of the trenches 29 in order to relax the silicon stress after the trench etch. This results to the structure shown in FIG. 12C.

The trenches 29 in substrate 21 run in parallel in a first direction (y in FIG. 14) and define a plurality of strip regions (220a–f in FIG. 14) of substrate 21 lying between each pair of adjacent trenches 29. The width of the trenches 29 and the width of the intervening strip regions can be equal and amount to the minimum design width F of the used process.

Figure 12D:
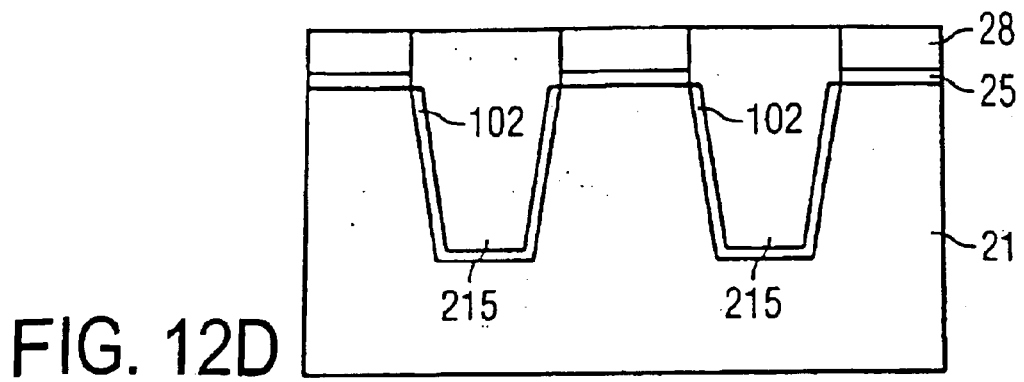

In a next process step, as illustrated in FIG. 12D, a CVD oxide layer 215 is deposited over the resulting structure (CVD=Chemical Vapor Deposition) and the surface is planarized by using a Chemical Mechanical Polishing (CMP) process using the pad nitride layer 28 as stopping layer.

Figure 12E:
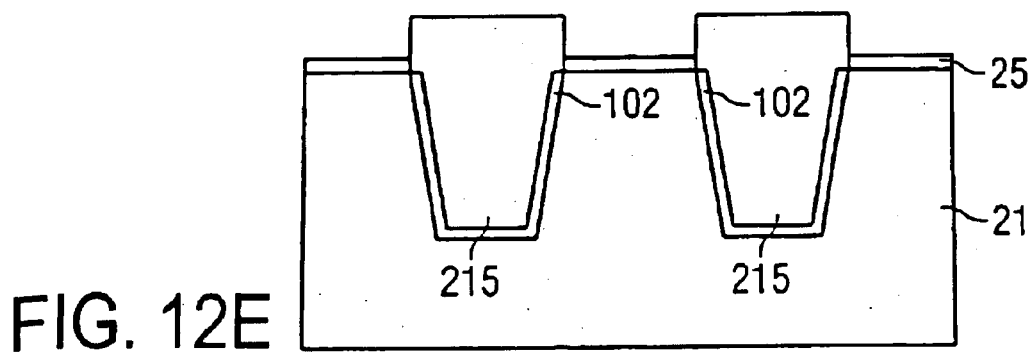

Thereafter, as shown in FIG. 12E the pad nitride layer 28 is removed by using an appropriate wet etch process.

Next, a first implantation step I1 is performed, using the pad oxide layer 25 as a scattering layer. This first implantation step I1 is a p-type implantation to enhance the doping concentration of the substrate 21 in a surface region 220 of the strip regions (220a–200f in FIG. 14) between the trenches 29 filled with the isolation oxide 215.

Figure 12F:
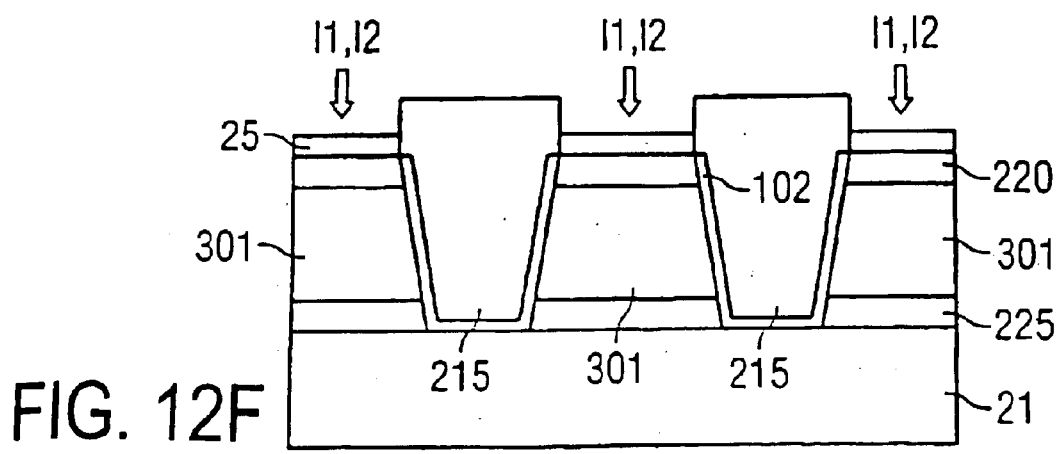

Next, a second implantation step I2 is performed with n-type ions. The second implantation step I2 provides a buried region 225 in the substrate 21, the depths of which approximately equals to or is less than the depths of the trenches 29, as also illustrated in FIG. 12F, forming an insulated region 301.

These implantation steps I1, I2 are optional and only used in the case that it is mandatory to isolate the shifting area from the substrate in order to obtain very limited shifting areas.

Figure 12G:
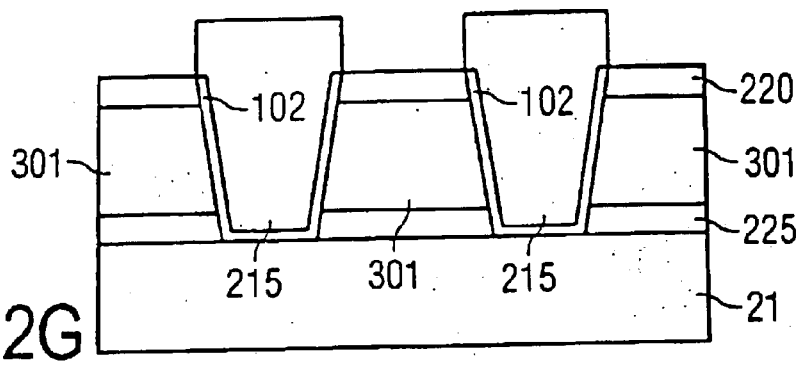

In a next step, as illustrated in FIG. 12G, also the pad oxide layer 25 is removed by a wet etch step.

Figure 12H:
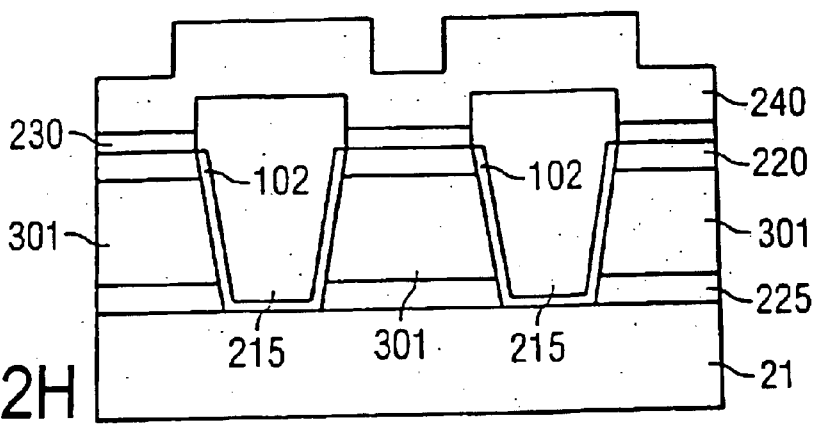

FIG. 12H illustrates that a tunnel oxide layer 230 is grown on the strip regions 220 in order to form the tunnel oxide of gate structures to be built-up between the field isolation trenches 29.

In a next process step, a first conductive polysilicon layer 240 is deposited on the resulting structure which serves as floating gate polysilicon layer.

In a subsequent process step, the first polysilicon layer 240 is partly removed by using a chemical mechanical polishing step using the trench isolation 215 as stopping layer or using a combination between process time and chemical stop as stopping layer. Anyhow, the STI height can be calibrated to adjust this step. This results to the structure shown in FIG. 12I.

Figure 12I:
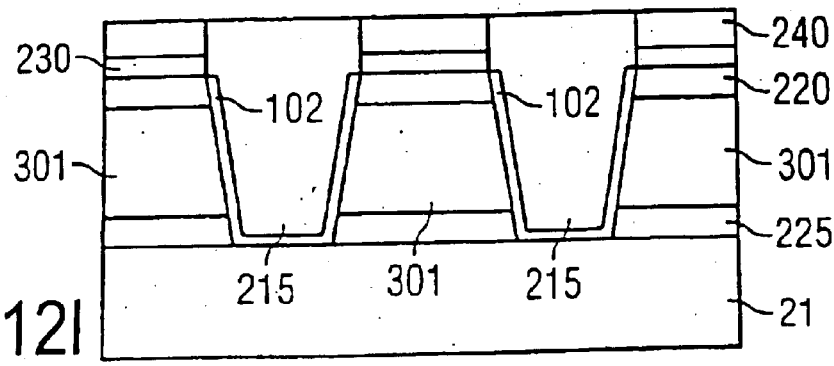
Figure 12J:
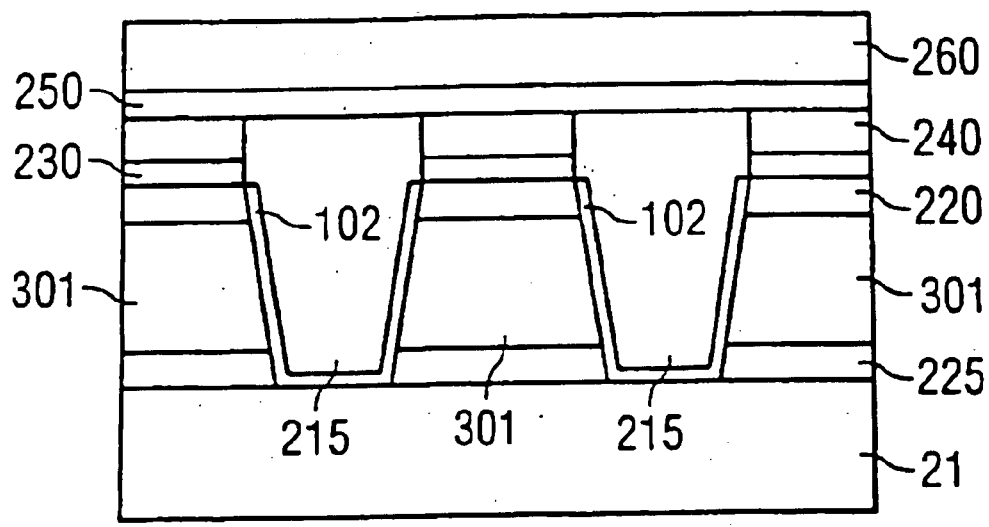

According to FIG. 12J, an insulation structure 250 in form of an ONO layer (ONO=Oxide-Nitride-Oxide) and thereafter a second conductive polysilicon layer 260 are deposited over the resulting structure. Then, a not shown mask is formed on the resulting structure, and the layers 230, 240, 250, 260 are patterned to form strips ST1, ST2, ST3 running in parallel to a second direction (x in FIG. 14) which perpendicularly crosses the strip regions 220 and accordingly the isolated trench regions 215.

Figure 13:
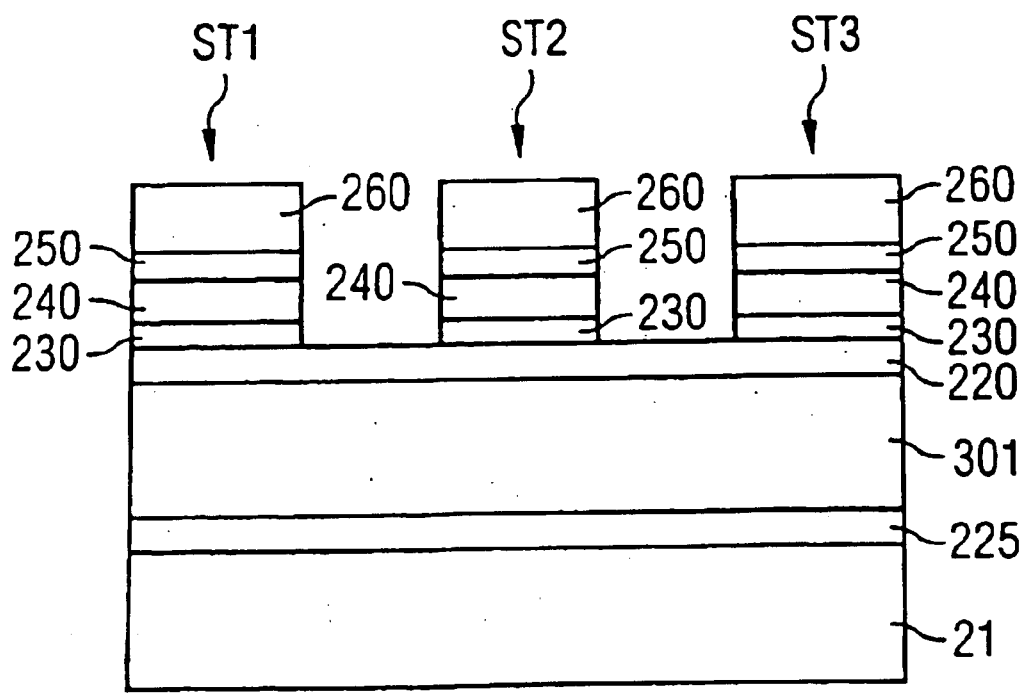
FIG. 13 is a schematic cross-sectional illustration corresponding to the process status of FIG. 12J perpendicular to the word line direction.

FIG. 13 shows a schematic illustration corresponding to the process status of FIG. 12J perpendicular to the word line direction.

FIG. 13 illustrates the result of the etching steps. Thus, gate structures comprising a tunnel oxide, floating gate, and isolation structure having worldlines on top in form of strips are obtained, where is clear that region 301 (p silicon) is insulated from the substrate 21 by the n-type layer 225 and is adjacent to two parallel STI trenches 215.

Figure 14:
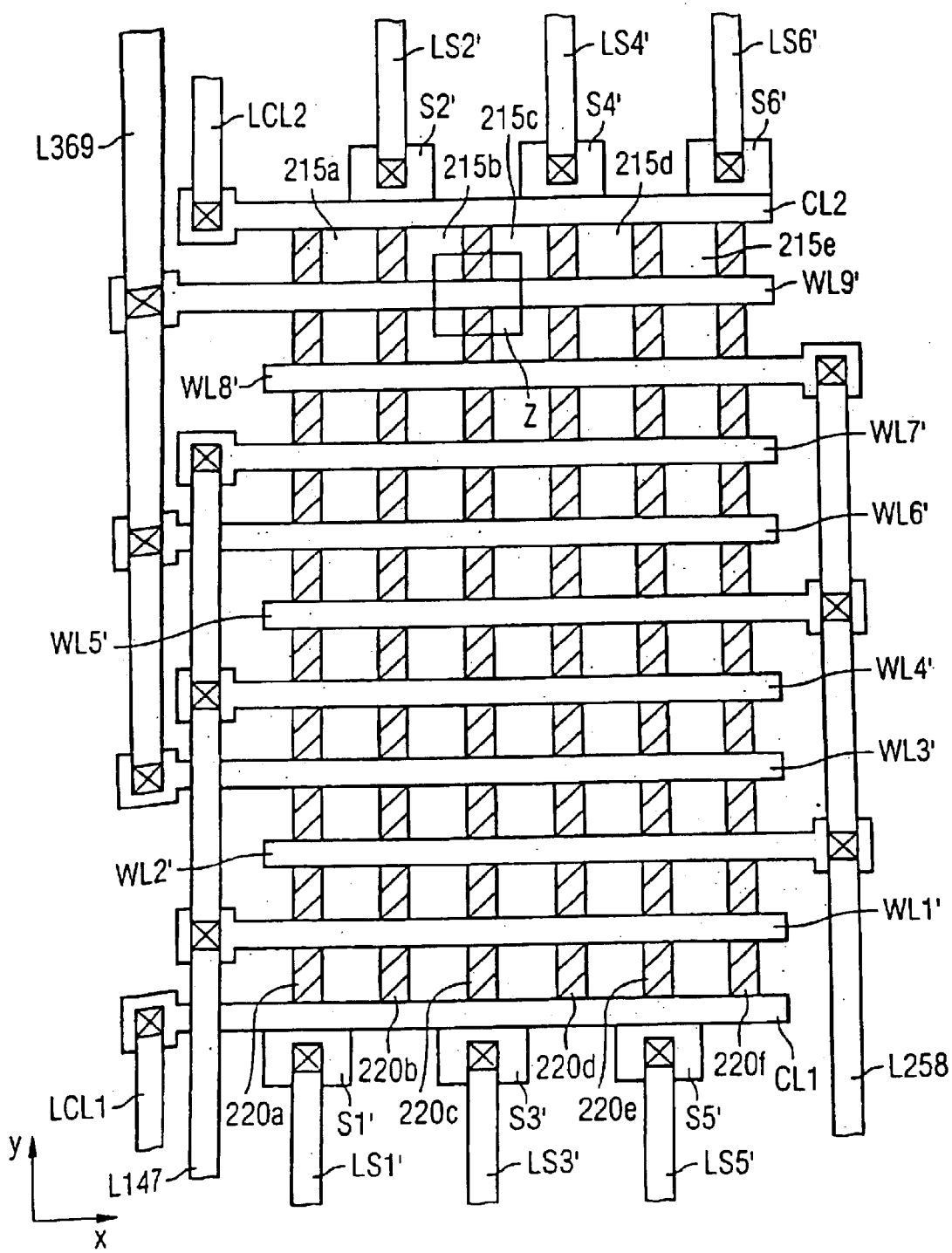
FIG. 14 is a top view of a two-dimensional CC-EEPROM cell arrangement according to the first embodiment of the present invention.

FIG. 14 shows top view of a two-dimensional CC-EEPROM cell arrangement according to the first embodiment of the present invention. In the top view of FIG. 14, the widths of the trench isolation regions 220a–220f and the distance of the word lines WL1'–WL9' has been depicted with doubled width in order to enhance clarity. This leads to a cell size of 9 $F^2$, as shown in cell Z in FIG. 14.

Of course, the gate structures 230, 240, 250, the word lines WL1'–WL9' and the space in between, and the trenches 29 may have minimum design width F which enables forming a minimum cell dimension of $4F^2$.

As may be further obtained from FIG. 14, a plurality of active regions S1'–S6' of the $n^+$-type is provided at the end of a corresponding strip 220a–200f and is electrical connectable to the gate structures of the corresponding strip by using an intervening control gate line CL1, CL2. The control gate lines CL1, CL2 are formed as normal MOSFET-gates, and not as gates including a floating gate. The active regions S1'–S6' are arranged at different ends of neighbouring strips 220a–220f and connected to wiring lines LS1'–LS6'. This arrangement also helps to realize the connection.

Moreover, every third word line of the word lines denoted as WL1'–WL9' is connected to a common wiring line L147, L369, L258, respectively. This connection scheme for the word lines which are made of the second polysilicon layer 260 in FIGS. 12A–12J and 13 is in accordance with the shifting scheme for operation of the semiconductor memory device as explained above.

The crosses in FIG. 14 denote contact holes for connecting the wirings to the respective semiconductor regions. Not shown in FIG. 14 are $p^+$-type bulk contacts at the end of the strips for electrically connecting the regions 301.

Figure 15A:
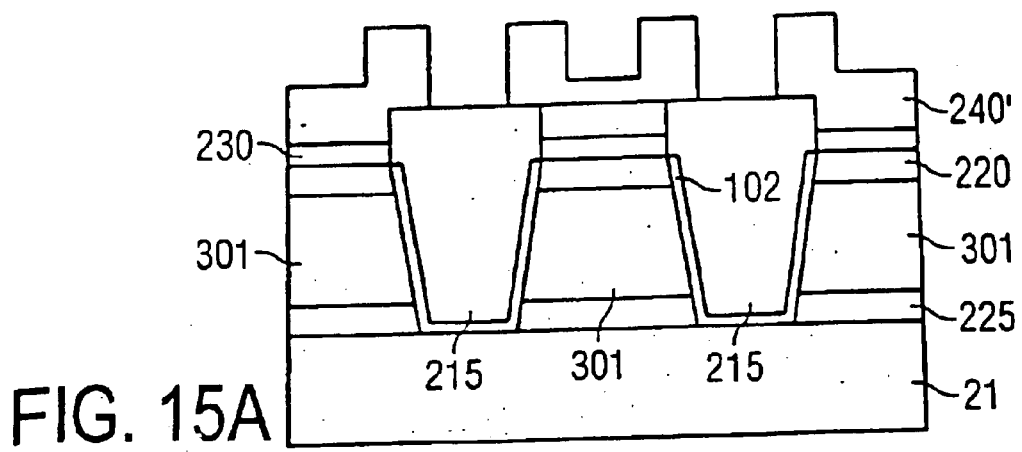
FIGS. 15A and 15B are a schematic cross-sectional illustration of processing steps for manufacturing the two-dimensional CC-EEPROM cell arrangement according to a second embodiment of the present invention in the word line direction.
Figure 15B:
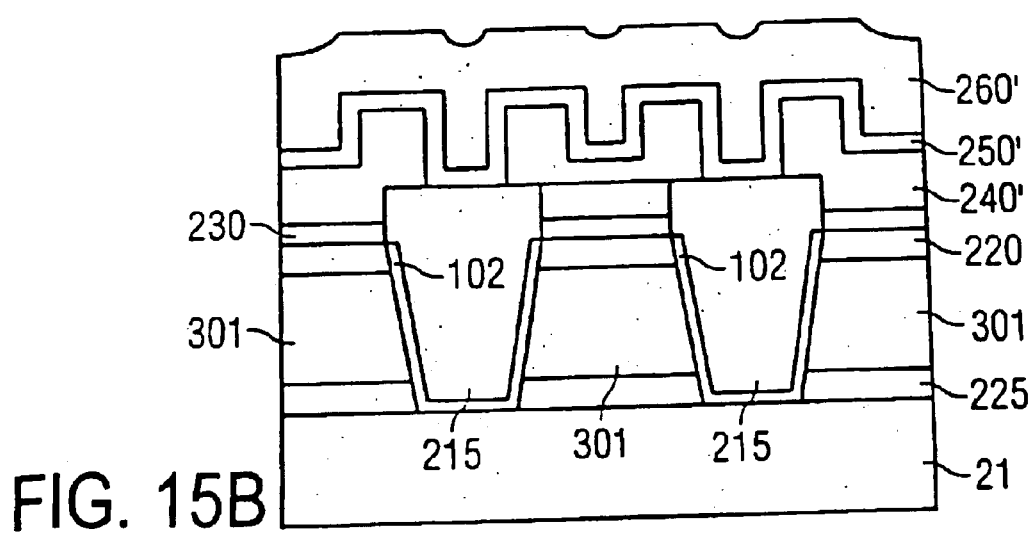

FIGS. 15A and 15B show a schematic cross-sectional illustration of processing steps for manufacturing the two-dimensional CC-EEPROM cell arrangement according to a second embodiment of the present invention in the word line direction.

According to the second embodiment shown in FIG. 15, the chemical mechanical polishing step shown in FIG. 12I is replaced by a photolithographic patterning step resulting in the structure shown in FIG. 15A. This photolithographic patterning step provides an overlay of the floating gate regions 240' over the isolating regions 215, i.e., a floating gate having a larger width.

The following process steps as illustrated in FIG. 15B including the deposition of the ONO isolation structure 250' and the deposition of the second polysilicon layer 260' and thereafter the not illustrated patterning step of the gate structures are the same as in the first embodiment explained above.

The process flow according to the second embodiment increases the minimum achievable cell size, namely to $6F^2$. However, it exhibits the advantage of a simple process flow and the advantage that the area of the junction between the word line 260' and the ONO isolation structure 250' is larger than the area between the floating gate 240' and the tunnel oxide. The latter results in electrical advantages during operation of the semiconductor memory device.

Figure 16A:
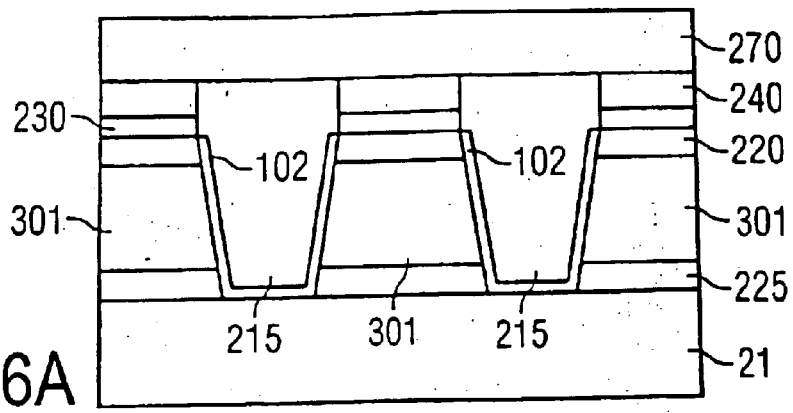
FIGS. 16A–16C show a schematic cross-sectional illustration of processing steps for manufacturing the two-dimensional CC-EEPROM cell arrangement according to a third embodiment of the present invention in the word line direction.
Figure 16B:
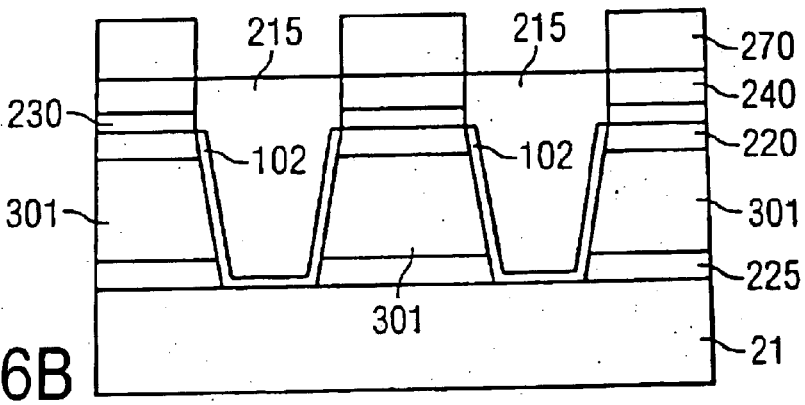
Figure 16C:
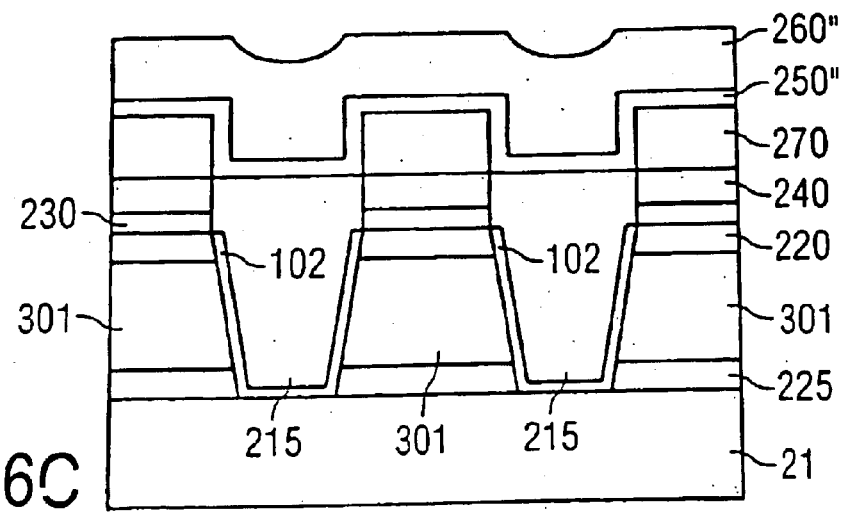

FIGS. 16A–16C show a schematic cross-sectional illustration of processing steps for manufacturing the two-dimensional CC-EEPROM cell arrangement according to a third embodiment of the present invention in the word line direction.

According to the third embodiment illustrated in FIGS. 16A–16C, the process is modified after the CMP step used to form the floating gate regions of the first polysilicon layer 240. Namely, a third polysilicon layer 270 is deposited over the resulting structure of FIG. 12I, as illustrated in FIG. 16A. The third polysilicon layer 270 is patterned for forming an extension of the floating gate regions of the first polysilicon layer, as illustrated in FIG. 16B.

Due to the presence of the isolation regions 215, a certain offset of the photomask of the process for patterning the third polysilicon layer 270 is not detrimental to the manufacture process.

In a next process step, the ONO isolation structure 250" and the second polysilicon layer 260" for forming the worldlines WL1'–WL9' are deposited and structures as explained above. The third embodiment exhibits the above mentioned electrical advantage of the second embodiment and furthermore the advantage that cell dimensions as small as $4F^2$ may be obtained.

In order to prove the most critical aspects to work—charge transfer, charge isolation and applying programming voltage—a device simulation was done. This simulation showed that it is possible to build up such a structure, which can shift charge, isolate it and apply a programming voltage while the quantity of isolated charge is only hardly altered by leakage current and thermal generation.

Although the present invention has been described with regard to specific embodiments, it is not limited thereto, but may be modified in many ways.

Particularly, CC-EEPROM cells or arrangements can also be mixed with other, well known EEPROM cells or cell elements in order to bring in their functionality.

Just for generality, it is possible to add some more gates or doping profiles to the arrangement mentioned above, which are added perpendicular to (or better: not in the same direction of) the shifting direction SD.

The floating gates of a CC-EEPROM cell can be routed out of the cell shifting area and can be connected to other structures (gate, flanked doping, transistor, tunnel oxide, . . . ),in order to provide additional functionality or to combine known NVM (non-volatile memory) principles (channel hot electron, Fowler-Nordheim tunneling, reading via MOSFET, . . . ) or charge shifting principles (CCD) with the CC-EEPROM cell principle. So, a minimum of one CCD principle is used in order to erase, program, read non-volatile memory.

Other embodiments not described here are also within the scope of the following claims.

What is claimed is:

1. A semiconductor memory device comprising:

a semiconductor substrate, positioned along a plane, having a first conductivity type;

a plurality of parallel trenches in the substrate extending in a first direction, parallel to the plane of the substrate, each trench being filled with an isolation material and having an adjacent trench separated therefrom by a strip region;

a plurality of gate structures, for storing charge in a nonvolatile manner, arranged above the surface of the substrate and electrically isolated therefrom, the gate structures being arranged in parallel strips extending in a second direction parallel to the plane of the substrate, the parallel strips crossing the strip regions;

a plurality of word lines, each of which is arranged on a corresponding gate structure from the plurality of gate structures; and a plurality of active regions of a second conductivity type, each of which is arranged at one end of a corresponding strip region and each of which is configured to allow free electrons of the active region to move from the active region to the gate structures of the corresponding strip region when a voltage is applied to the gate structures of the corresponding strip region, wherein the corresponding strip region between at least two gate structures is devoid of any active regions of the second conductivity type.

2. The device of claim 1, wherein the plurality of gate structures includes a stack of tunnel oxide, a floating gate, and an isolation structure.

3. The device of claim 1, wherein the plurality of active regions are arranged at alternate ends of adjacent strip regions.

4. The device of claim 1, wherein the active regions are electrically connectable to the gate structures of the corresponding strip region by using a respective control gate structure.

5. The device of claim 4, wherein each respective control gate structure extends in parallel with respective outermost gate structures at a corresponding end.

6. The device of claim 1, further comprising a common wiring line connected to every third of the plurality of word lines.

7. The device of claim 1, wherein the first direction and the second direction are perpendicular to each other.

8. The device of claim 1, wherein the substrate has a doping concentration that is varied in a surface region of the strip regions by implantation.

9. The device of claim 1, wherein a region of the second conductivity type is buried in the substrate along the strip regions.

10. The device of claim 1, wherein the gate structures, the word lines and the trenches have a minimum design width, F, forming a cell dimension of $4F^2$.

11. A method of manufacturing a semiconductor memory device, the method comprising:

providing a semiconductor substrate, positioned along a plane, having a first conductivity type;

providing a plurality of parallel trenches in the substrate, each trench extending in a first direction parallel to the plane of the substrate and having an adjacent trench separated therefrom by a strip region of the substrate;

filling the trenches with an isolation material;

providing a plurality of gate structures for non-volatile storage of charge above the surface of the substrate, the gate structures being electrically isolated from the substrate and being arranged in parallel strips in a second direction parallel to the plane of the substrate, the parallel strips crossing the strip regions;

providing a plurality of word lines, each of which is arranged on a corresponding gate structure; and providing a plurality of active regions of a second conductivity type, each of which is arranged at one end of a corresponding strip region and each of which is configured to allow free electrons of the active region to move from the active region to the gate structures of the corresponding strip region when a voltage is applied to the gate structures of the corresponding strip region;

wherein the corresponding strip region between at least two gate structures is devoid of any active regions of the second conductivity type.

12. The method of claim 11, further comprising:

providing the plurality of trenches through an etching process using a hard mask;

providing an oxide layer on the inner surface of the trenches;

depositing a layer of the isolation material on the resulting structure; and planarizing the layer of the isolation material by a chemical-mechanical polishing process until the layer levels with the hard mask.

13. The method of claim 12, further comprising: providing a tunnel oxide layer and a first polysilicon layer over the resulting structure; and planarizing the first polysilicon layer by a chemical-mechanical polishing process until the layer levels with the isolation material for forming a floating gate region.

14. The method of claim 13, further comprising:

providing a third polysilicon layer on the resulting structure; and patterning the third polysilicon layer for forming an extension of the floating gate region.

15. The method of claim 14, further comprising:

providing an isolation layer having contact holes between the first polysilicon and the third polysilicon layer, the contact holes being arranged for providing an electrical connection between the first polysilicon layer and the third polysilicon layer.

16. The method of claim 12, further comprising:

removing the hard mask;

providing a tunnel oxide layer and a first polysilicon layer over the resulting structure; and patterning the first polysilicon layer for forming a floating gate.

17. The method of claim 13, further comprising:

providing an isolation layer and a second polysilicon layer for forming a control gate region on the resulting structure; and forming the plurality of gate structures by patterning the tunnel oxide layer, first polysilicon layer, isolation layer and second polysilicon layer.

18. The method of claim 11, further comprising:

enhancing the doping concentration of the substrate in a surface region of the strip regions using a first implantation process; and burying a region of the second conductivity type in the substrate along the strip regions using a second implantation process.

* * * * *